United States Patent

Soichi et al.

[11] Patent Number: 5,917,863
[45] Date of Patent: Jun. 29, 1999

[54] VITERBI DECODING METHOD AND APPARATUS EMPLOYING TIME-REVERSED POSITIVE AND NEGATIVE PEAK VALUES

[75] Inventors: Iwamura Soichi; Jin-kyu Jeon, both of Suwon, Rep. of Korea

[73] Assignee: Samsung Electronics Co., Ltd., Kyungki-Do, Rep. of Korea

[21] Appl. No.: 08/743,912

[22] Filed: Nov. 5, 1996

[30] Foreign Application Priority Data

Apr. 17, 1996 [KR] Rep. of Korea ........................ 96-11620

[51] Int. Cl.⁶ .......................... H03M 13/00; G11B 20/18
[52] U.S. Cl. .......................... 375/341; 371/43.7; 360/29; 360/39
[58] Field of Search .................................... 375/262, 290, 375/341; 371/40.14, 40.15, 40.16, 43.6, 43.7; 360/29, 39, 40, 41, 48

[56] References Cited

U.S. PATENT DOCUMENTS 5,373,400 12/1994 Kovacs ...................................... 360/46
5,392,316 2/1995 Sawaguchi et al. ..................... 375/290

FOREIGN PATENT DOCUMENTS

WO 95/15551 6/1995 WIPO .

OTHER PUBLICATIONS

Raphaeli, D. and Kaitz, T., "A Reduced Complexity Algorithm for Combined Equalization and Decoding for Channels with Multipath, ISI or Partial Response," Proc. 1995 IEEE Global Telecomm. Conf., pp. 83–87, Nov. 1995.

*Primary Examiner*—Stephen Chin
*Assistant Examiner*—Jeffrey W. Gluck
*Attorney, Agent, or Firm*—Sughrue, Mion, Zinn, Macpeak & Seas, PLLC

[57] ABSTRACT

A Viterbi decoding circuit for decoding an input signal is provided. The circuit contains a detector, a first converter, a Viterbi decoder, a second converter, and a selector. The input signal is grouped into a current and subsequent input signal group. The detector detects negative peak data values and positive peak data values from the current input signal group. The first converter converts the positive and negative peak data in a reverse direction to produce reverse positive and negative peak data, respectively. The Viterbi-decoder decodes the reverse positive and negative peak data with respect to a predetermined number of initial states and generates current reverse decoded data groups which respectively correspond to a plurality of channels and respectively correspond to the initial states. In addition, the Viterbi decoder generates a control signal based on a state of initial decoded data corresponding to the subsequent input signal group. The second converter converts the current reverse decoded data groups in a forward direction to produce current forward decoded data groups for the channels, respectively. The selector selects a particular current forward decoded data group for a particular channel based on the control signal. In addition, a method which is performed by the circuit is also provided.

27 Claims, 10 Drawing Sheets

FIG. 5A
| REFERENCE TIME | k | 0 | 1 | 2 | 3 | 4 | 5 | 6 | 7 |
|---|---|---|---|---|---|---|---|---|---|
| INPUT DATA | $a_k$ | −1 | 1 | 1 | −1 | 1 | −1 | −1 | 1 |
| PRECODER OUTPUT | $b_k$ | −1 | 1 | −1 | −1 | 1 | 1 | 1 | −1 |
| IMPULSE RESPONSE OF EACH CHANNEL | $b_0(1-D)$ | −1 | 1 | | | | | | |
| | $b_1(1-D)$ | | 1 | −1 | | | | | |
| | $b_2(1-D)$ | | | −1 | 1 | | | | |
| | $b_3(1-D)$ | | | | −1 | 1 | | | |
| | $b_4(1-D)$ | | | | | 1 | −1 | | |
| | $b_5(1-D)$ | | | | | | 1 | −1 | |
| | $b_6(1-D)$ | | | | | | | 1 | −1 |
| | $b_7(1-D)$ | | | | | | | | −1 |
| CHANNEL OUTPUT | $y_k$ | | 2 | −2 | 0 | 2 | 0 | 0 | −2 |
| DECODED DATA | $c_k$ | | 1 | 1 | −1 | 1 | −1 | −1 | 1 |
FIG. 5B
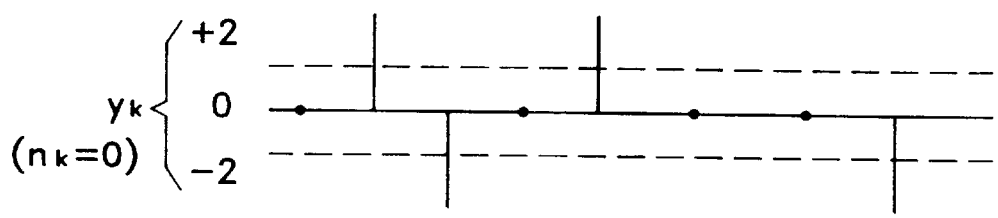
FIG. 5C
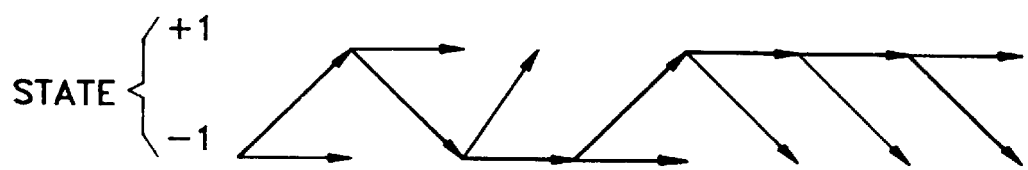

VITERBI DECODING METHOD AND APPARATUS EMPLOYING TIME-REVERSED POSITIVE AND NEGATIVE PEAK VALUES

FIELD OF THE INVENTION

The present invention relates to a Viterbi decoding method and apparatus. More particularly, the present invention relates to a Viterbi decoding method which enables high-speed and high-density recording and reproducing of digital information. Furthermore, the invention corresponds to a circuit which performs the method and has a simple hardware structure.

BACKGROUND OF THE INVENTION

Recently, a recording/reproducing apparatus adopting a digital mode has been created for recording and/or reproducing digital information. Specifically, the apparatus converts video and audio signals into digital signals, and the digital signals are recorded on a magnetic recording medium via source encoding and channel encoding processes. Then, the digital signal may be reproduced from the recording medium via channel decoding and source decoding processes.

FIG. 1 shows a signal processing system in a digital videocassette recorder which comprises a recording portion and a reproducing portion. The recording portion contains first and second analog-to-digital (A/D) converters 110 and 120, a video data encoder 130, an error-correction encoder 140, a recording encoder 150, a recording amplifier 160, and a recording magnetic head HD1. The reproducing portion includes a playback magnetic head HD2, a playback amplifier 210, a data detector 220, an error-correction decoder 230, a video data decoder 240, and first and second digital-to-analog (D/A) converters 250 and 260.

In the recording portion, the first A/D converter 110 converts an analog video signal into a digital video signal, and the second converter 120 converts an analog audio signal into a digital audio signal. Then, the digital video signal is compressed in accordance with a high-efficiency code by the video data encoder 130, and the encoder 130 outputs corresponding compressed video data. Afterwards, the error-correction encoder 140 synthesizes the compressed video from the encoder 130 and the digital audio data from the A/D converter 120 to produce synthesized data. Then, the encoder 140 adds parity data to the synthesized data using an error correction code such as a Reed Solomon (RS) code to generate error-correction coded data.

The recording encoder 150 inputs the error-correction coded data and encodes such data to produce a compensated code. Then, the recording amplifier 160 amplifies the compensated code, and the amplified signal is recorded on a magnetic tape T via the recording magnetic head HD1.

The detailed configuration of the recording encoder 150 is shown in FIG. 2. In particular, the encoder 150 comprises a channel modulator 151, a precoder 152, and a recording compensation circuit 153. The channel modulator 151 inputs the error-correction coded data from the encoder 140, encodes such data using an 8-to-14 or 24-to-25 modulation scheme, and outputs corresponding channel modulated data. The precoder 152 converts the channel modulated data into a non-return-to-zero inversion (NRZI) code.

The recording compensation circuit 153 inputs the NRZI code, compensates for the deterioration of the recording characteristics associated with such code, and outputs a corresponding compensated code to the recording amplifier 160. The circuit 153 may comprise a recording equalizer (not shown) which equalizes the NRZI code in order to compensate for the deterioration, or alternatively, the recording equalizer may be provided separately from the compensation circuit 153.

Referring back to the reproducing portion of the apparatus shown in FIG. 1, a signal is reproduced from the magnetic tape T via the playback magnetic had HD2, and the reproduced signal is amplified by the playback amplifier 210 to produce an amplified signal. Afterwards, the data detector 220 detects the video and audio data contained in the amplified signal and outputs related channel decoded data. Then, the error-correction decoder 230 corrects any errors contained in the channel decoded data and outputs corresponding error corrected video data and error corrected audio data. The video data decoder 240 decodes the error corrected video data to produce decoded video data, and the decoded video data is converted into an analog video signal via the first D/A converter 250. On the other hand, the error corrected audio data is converted into an audio signal via the second D/A converter 260.

The internal structure of the data detector 220 is illustrated in FIG. 3. In particular, the detector 220 contains an automatic gain control (AGC) amplifier 221, a low pass filter 222, an A/D converter 223, an equalizer 224, a timing detector 225, a Viterbi decoding circuit 226, and a channel demodulator 227.

The AGC amplifier 221 inputs the amplified signal from the playback amplifier 210 and outputs an amplitude adjusted signal. The low-pass filter 222 removes any high-frequency noise contained in the amplitude adjusted signal and outputs a corresponding filtered signal. Then, the A/D converter 223 converts the filtered signal into digital data, and the equalizer 224 compensates for any distortion in the waveform and level of the digital data and outputs a corresponding equalized signal. The timing detector 225 detects the predetermined frequency and timing of the equalized signal via a phase-locked loop (PLL) circuit (not shown). Then, the detector 225 outputs a sampling clock to the A/D converter 223 and a driving clock (not shown) for other circuits of the reproducing portion. The Viterbi decoding circuit 226 Viterbi-decodes the equalized signal to produce Viterbi decoded data, and the channel demodulator 227 demodulates such data in accordance with the modulation scheme mentioned above to generate the channel demodulated data. Subsequently, the channel demodulated data is output to the error-correction decoder 230 shown in FIG. 1.

In order to increase the recording density of a signal without significantly changing the characteristics of conventional recording/reproducing systems, various technological advances have been utilized. For example, technologies relating to partial response maximum likelihood responses, including a Viterbi decoding process, have been advanced, and many circuits implementing such technologies have been introduced.

An example of a circuit which implements a Viterbi decoding process using an NRZI code having two states $S_{-1}$ and $S_1$ is shown in FIG. 4A. Specifically, the circuit contains a precoder 152, a magnetic recording/reproducing channel 200, an adder 201, and a Viterbi decoding circuit 226. (Please note that the precoder 152 and the Viterbi decoding circuit 226 are designated by the same reference numerals which designate the corresponding components in FIGS. 2 and 3).

The precoder 152 is referred to as a "1T precoder" or a "PR(1,−1) type system" and includes a delay 11 and a modulo-2 adder 12. The delay 11 inputs the data (e.g., NRZI code data) $b_{k-1}$ output from the adder 12 at time k–1 and delays such data $b_{k-1}$ by one bit to produce delayed data. Then, the adder 12 receives input data $a_k$ and the delayed data at time k, performs an exclusive OR operation on such data, and outputs NRZI code data $b_k$ at time k.

The magnetic recording/reproducing channel 200 has a differential characteristic (1–D), inputs the data $b_k$, and outputs corresponding channel data $z_k$ having no noise. The adder 201 is used to introduce Gaussian noise into the channel for mathematical modeling purposes. Specifically, the adder 201 inputs the channel data $z_k$ and a noise signal $n_k$ and adds such signals $z_k$ and $n_k$ to produce a channel output $y_k$. In other words, the channel output $y_k$ can be represented by equation (1):

$$y_k = z_k + n_k \text{ (if } n_k = 0, y_k = z_k) \tag{1}$$

Then, the Viterbi decoding circuit 226 inputs the channel output $y_k$ and decodes the output $y_k$ to generate decoded data $c_k$.

As shown in FIG. 4A and described above, the input data $a_k$ is binary coded information having a value of –1 or 1 at a time k, and the code data $b_k$ is output from the precoder 152 at time k. Furthermore, the value D is a delay operator for a one bit delay to delay the code data $b_k$ by one bit. In addition, the value (1–D) represents the differential characteristic of the magnetic recording/reproducing channel 200, and the channel data $z_k$ is output from the channel 200 at time k and introduces no noise. The noise $n_k$ represents the Gaussian noise which is superposed on the channel data $z_k$ at time k, and the channel output $y_k$ represents the signal which is input to the Viterbi decoding circuit 220 at time k. Finally, the decoded data $c_k$ is the data output from the decoding circuit at time k.

FIG. 4B depicts a state diagram of the operation of the precoder 152. Specifically, the precoder has two states $S_{-1}$ (S=–1) and $S_1$ (S=1) and the arrows in the figure represent potential transitions from one state to another state or back to the same state. In addition, the designations "X"/Y relating to each of the arrows represent signals which are input to and output from the system. In particular, the value X corresponds to the input data $a_k$ received by the precoder 152, and the value Y represents the channel data $z_k$ output from the magnetic recording/reproducing channel 200.

The relationship between the data $a_k$ input to the decoder 152 and the decoded data $c_k$ output from the Viterbi decoding circuit 226 is summarized in FIG. 5A. Also, FIG. 5B schematically shows the channel output $y_k$ supplied to the Viterbi decoder 226 when no noise $n_k$ is superposed upon the output $y_k$, and FIG. 5C is a trellis diagram showing the state transition of the channel output $y_k$.

In the normal operation of the apparatus illustrated in FIGS. 1–3, some noise is contained in the equalized signal output from the equalizer 224 and input to the Viterbi decoding circuit 226 (FIG. 3). This noise primarily results from granular particles adhered to the tape T, the impedance of the magnetic head HD2, the initial bias resistance of the playback amplifier 210, etc. Accordingly, since the reproduced signal passes through the head HD2, amplifier 210, equalizer 224, etc., the range of the equalized signal and the superposed noise is varied when the signal is input to the Viterbi decoding circuit 226.

As shown in FIG. 6A, the actual waveform of the equalized signal is an analog waveform in which the actual data and the superposed noise cannot be completely separated from one another and distinctly identified. Accordingly, the Viterbi decoding circuit 226 quantizes a positive direction amplitude of the normalized inputs (+1, 0, –1) as one of two values "H" and "L" via an $H_n$ detecting comparator (not shown) Specifically, the $H_n$ detecting comparator outputs positive peak data $H_n$ having the value "H" when the input signal is above the threshold "+1" and outputs positive peak data $H_n$ having the value "L" when the input signal is below the threshold "+1".

Similarly, the Viterbi decoding circuit 226 quantizes a negative direction amplitude of the normalized inputs (+1, 0, –1) as one of two values "H" and "L" via an $L_n$ detecting comparator (not shown). In particular, the $L_n$ detecting comparator outputs negative peak data $L_n$ having the value "H" when the input signal is below the threshold "–1" and outputs negative peak data $L_n$ having the value "L" when the input signal is above the threshold "+1".

Moreover, as mentioned above, the magnetic recording/reproducing channel 200 has a differential characteristic 1–D and the precoder 152 corresponds to a partial response type PR(1,–1) system. As a result, only positive peak data $H_n$ having a value "L" ("0") or negative peak data $L_n$ having a value "H" ("–1") is output after previous positive peak data $H_n$ having a value "H" ("+1") if no noise is present. In other words, positive peak data $H_n$ having a value of "+1" is never output after previous positive peak data $H_n$ having a value "+1" has been output. Similarly, only negative peak data $L_n$ having a value "L" ("0") or positive peak data $H_n$ having a value "H" ("+1") is output after previous negative peak data $L_n$ having a value "H" ("–1"). Consequently, negative peak data $L_n$ having a value "–1" is not output after previous negative peak data $L_n$ having a value "–1" has been output. FIG. 6B depicts a trellis diagram of the binary states S=1 and S=–1 during the operation of the Viterbi decoding circuit 226 when it receives the equalized signal shown in FIG. 6A.

On the other hand, as shown in FIG. 7A, when noise $n_k$ is superposed on the channel output $y_k$ that is input to the Viterbi decoding circuit 226, the principle described above may not be satisfied. In particular, the figure shows that the channel output (i.e., detection data) $y_k$ contains an error due to noise because the value "+1" is detected at the time k=5 after the value "+1" has been detected at the time k=3. Accordingly, since the precoder 152 is a partial response type PR(1, –1) system, the channel output $y_k$ is deemed to be corrupted by noise when a value "+1" is output after a value "+1" or if a value "–1" is output after the value "–1" (irrespective of the number of "0s" therebetween).

In order to properly determine the correct channel output $y_k$, the Viterbi decoding process uses an index for determining the correct value of the detected data based on which path of the trellis diagram has the highest probability of being correct. In particular, the metrics for each path are calculated, a surviving path is determined based on such calculations, and information relating to the surviving path is stored in a memory. Thus, when new input data $a_k$ is input, the information relating to the final surviving path is read from memory and used to decode the data $a_k$. As a result, the Viterbi decoding circuit 226 requires various devices such as an A/D converter, a microprocessor, an adder, etc.

However, if the states of the decoding circuit 226 are binary, a peak value of the signal in the positive direction ("positive peak value") and a peak value of the signal in the negative direction ("negative peak value") can replace the role of the values of the metrics of the trellis diagram. Thus, the circuit is preferably designed such that it can detect the positive peak value of the signal and maintain the level of such value as a new threshold value to detect subsequent positive peak values. Moreover, the circuit is preferably designed such that the threshold value for detecting the negative peak values is constantly updated. In other words, the new threshold for detecting the negative peak value should always be lower than the threshold for detecting the positive peak value by a predetermined value A.

In addition, the negative peak value is detected and maintained as the new threshold value for determining the next negative peak value. Specifically, the detected value is used as the new threshold value for detecting the value "−1" of the channel output $y_k$ and is simultaneously used to correct the threshold at which the value "+1" is detected by setting such threshold to be higher than the threshold for detecting the value "−1" by the quantity A. As a result, the system is prepared to detect the next positive peak value or the next negative peak value of the channel output $y_k$.

If the circuit implements the above design, an error contained in the output $y_k$ can be detected and corrected. As shown in FIG. 7B, when consecutive "1"s or consecutive "0"s are detected, the leading one of the two data is deemed to be corrupted by noise. Thus, the state of the data is inverted.

The theory and research for interlocking the positive peak value and the negative peak value such that the difference between them is equals a predetermined offset (i.e. the value A) is described in an article entitled "Signal processing method PRML, achieving large capacity memory device of the next generation" in *Japanese Nikkei Electronics*, No. 599, pp. 72–97, January, 1994.

Referring to FIG. 8, the structure of a conventional Viterbi decoding circuit will be described. Such circuit is described in the following articles: "Optimal Reception for Binary Partial Response Channels" by M. J. Ferguson in *Bell Syst. Tech. J.*, 51(2), pp. 493–505, February, 1972, and "Viterbi Detection of Class IV Partial Response on a Magnetic Recording Channel" by R. W. Wood and D. A. Petersen in *IEEE Trans. Comm.*, Vol. Com-34, No. 5, pp. 454–461, May, 1986.

In FIG. 8, input data $y_k$ is quantized in an A/D converter (not shown) and has a value of −2, 0, or +2. Then, the data $y_k$ is supplied to an adder 232 and a sample-hold device 231, and the device 231 updates or maintains the value of the input data $y_k$ depending on a signal output from an exclusive OR gate 235. Specifically, when the state of the input data $y_k$ changes, the data output from the device 231 is updated. However, when the state of the data $y_k$ does not change, the sample-hold device 231 maintains the value of the data $y_k$.

As shown in the trellis diagram illustrated in FIG. 7B, the original input data $y_k$ of the NRZI code are decoded to have the value "+1(H)" when the state S changes and are decoded to have the value "−1(L)" when the state S does not change. Preferably, the decoded result is written in the RAM 243 as "−1(L)" as a default when the state S does not change and is written as "+1(H)" when the state S changes.

When the state of the input data $y_k$ changes, the exclusive OR gate 235 outputs a "1", and the output of an exclusive OR gate 236 is written to a point address of the RAM 243 via a switch 239. Also, when the output of the exclusive OR gate 235 is "0", a value of "−1(L)" (e.g. GND) is written in an address of the RAM 243 via the switch 239. Accordingly, all of the decoded data $c_k$ are stored in the RAM 243.

In order to generate the point address, the counter 240 repetitively counts from zero to an upper limit. The upper limit is determined based on the word length of the decoded data word. For example, if the data is decoded by a unit of eight bits, the counter 240 repetitively counts from zero to seven. The point register 241 inputs the address counted by the counter 240 and the output of the exclusive OR gate 235 and outputs the point address such that the output of the exclusive OR gate 235 is transferred only when the states are changed.

On the other hand, as each new divergent point on the trellis diagram is established, one of the two potential paths is terminated. In other words, the establishment of each divergent point generates a new ambiguous bit and also settles some proceeding ambiguity. Accordingly, if the path diverges at a time P, a final surviving path from the previous time p is determined at the next divergent point. Thus, the change of the state S at the time p is known and the value "+1(H)" or "−1(L)" of the decoded data $c_k$ can be accurately written in the address p of the RAM 243 in response to the change of the state S.

However, when Viterbi decoding is performed on the basis of trellis diagrams, computing the value of the metric at each divergent point via a microprocessor and storing the result of such computation in memory is necessary. Thus, in the conventional Viterbi decoding circuit illustrated in FIG. 8, an A/D converter (not shown), a microprocessor (not shown), the RAM 243, and the address counter 240 are required. Thus, when the Viterbi decoding circuit is made into an integrated circuit (IC), the chip size and the cost of the IC are relatively large due to the addition of the components above. For example, sixty four comparators should be installed in a 6-bit flush type A/D converter which is used in a conventional Viterbi decoding circuit.

SUMMARY OF THE INVENTION

In order to solve the above problems, an object of the present invention is to provide a Viterbi decoding method in which Viterbi decoding is performed from a reverse direction in a trellis diagram so that the decoding is simplified.

Another object of the present invention is to provide a Viterbi decoding circuit having a simple hardware configuration which does not require an A/D converter and microprocessor.

In order to achieve the objects above, a Viterbi decoding method for decoding an input signal is provided. In particular, the method comprises the steps of: (a) grouping said input signal into at least a current input data group and a subsequent input data group in accordance with predetermined time segments; (b) detecting negative peak data values and positive peak data values for said current input data group, wherein said negative peak data values and said positive peak data values are instantaneous values; (c) converting said positive peak data values in a reverse direction to produce reverse positive peak data and converting said negative peak data values in said reverse direction to produce reverse negative peak data; (d) Viterbi-decoding said reverse positive peak data and said reverse negative peak data with respect to a predetermined number of initial states and generating current reverse decoded data groups which respectively correspond to a plurality of channels and which respectively correspond to said predetermined number of initial states; (e) converting said current reverse decoded data groups in a forward direction to produce current forward decoded data groups for said channels, respectively; and (f) selecting a particular current forward decoded data group for a particular channel based on a state of initial decoded data corresponding to said subsequent input data group.

In order to further achieve the objects above, a Viterbi decoding circuit for demodulating a reproduced signal in a magnetic recording/reproducing apparatus is provided.

Specifically, the circuit comprises: peak detecting means for interlocking a positive peak detecting threshold and a negative peak detecting threshold in order to maintain a difference between said positive and negative peak detecting thresholds at a predetermined offset value, for detecting positive peak values and negative peak values of a current reproduced signal group, and for generating positive peak data values and negative peak data values corresponding to said current reproduced signal group, wherein said positive peak data values and said negative peak data values are instantaneous values and wherein said reproduced signal is grouped into at least said current reproduced signal group and a subsequent reproduced signal group; first reverse converting means for converting said positive peak data in a reverse direction to produce reverse positive peak data; second reverse converting means for converting said negative peak data in a reverse direction to produce reverse negative peak data; Viterbi-decoding means for Viterbi-decoding said reverse positive peak data and said reverse negative peak data with respect to both a first initial state and a second initial state to generate a first current reverse decoded data group which corresponds to a first channel and a second current reverse decoded data group which corresponds to a second channel, wherein said first and second current reverse decoded data groups respectively correspond to said first and second initial states and wherein said Viterbi decoding means generates a selection control signal based on a state of initial decoded data of said subsequent reproduced signal group; first forward converting means for converting said first current reverse decoded data group in a forward direction to produce a first current forward decoded data group for said first channel; second forward converting means for converting said second current reverse decoded data group in said forward direction to produce a second current forward decoded data group for said second channel; and selecting means for selecting one of said first current forward decoded data group and said second current forward decoded data group as a selected current forward decoded data group, wherein said one of said first current forward decoded data group and said second current forward decoded data group is selected based on said selection control signal.

BRIEF DESCRIPTION OF THE DRAWINGS

The above objects and advantages of the present invention will become more apparent by describing in detail a preferred embodiment thereof with reference to the attached drawings in which:

FIG. 5A is a table summarizing the values of various signals used in the Viterbi decoding process performed by the circuit in FIG. 4A;

FIG. 5B is a diagram of a channel output signal contained in the table shown in FIG. 5A;

FIG. 5C is a trellis diagram illustrating the state transitions of channel output signal shown in FIG. 5B;

DETAILED DESCRIPTION OF THE PREFERRED EMBODIMENTS

The following description of the preferred embodiments discloses specific circuit configurations, components, logical states, bit numbers, and frequencies. However, the preferred embodiments are merely examples of the present invention, and thus, the specific components and values described below are only used to more easily describe such embodiments and to provide an overall understanding of the present invention. Accordingly, one skilled in the art will readily recognize that the present invention is not limited to the specific components and values described below. Furthermore, the descriptions of various features and structures of the present invention which would be known to one skilled in the art are omitted for the sake of clarity and brevity.

One concept of the present invention relates to performing a Viterbi decoding method in a reverse direction along a state transition diagram (e.g., a trellis diagram). As a result, each "divergent" point only has one possible path along which to travel, and therefore, calculating and storing the metric values of the paths of the trellis diagram are not required. Accordingly, the use of a microprocessor and memory for respectively performing the calculating and storing operations are not necessary. Also, since the decoding method operates in the reverse direction, the path on the state transition diagram can be determined by an instantaneous value obtained by detecting the positive or negative peak value of the input signal.

In order to perform the Viterbi decoding method in the reverse direction, the input signal is segmented into predetermined time periods (e.g., predetermined numbers of bits). Then, the positive and negative peak values of the input signal in each group are detected instead of calculating the metrics of such values, and the values are processed in the reverse direction to obtain Viterbi-decoded data.

In addition, since the value of the Viterbi-decoded data corresponding to the present group of the input signal depends upon the state of the first decoded data corresponding to the next group of the input signal, two channels of the reverse Viterbi-decoded data are simultaneously generated. Then, the order of the reverse Viterbi-decoded data for each channel of the present group is reversed to produced forward Viterbi-decoded data for each channel. Afterwards, the forward Viterbi-decoded data for both channels are delayed in parallel until the state of the initial decoded data of the next group is determined. When the state of the initial decoded data of the next group is ascertained, the channel containing the appropriate forward Viterbi-decoded data is selected, and such forward Viterbi-decoded data is output as the final decoded data.

Figure 1:
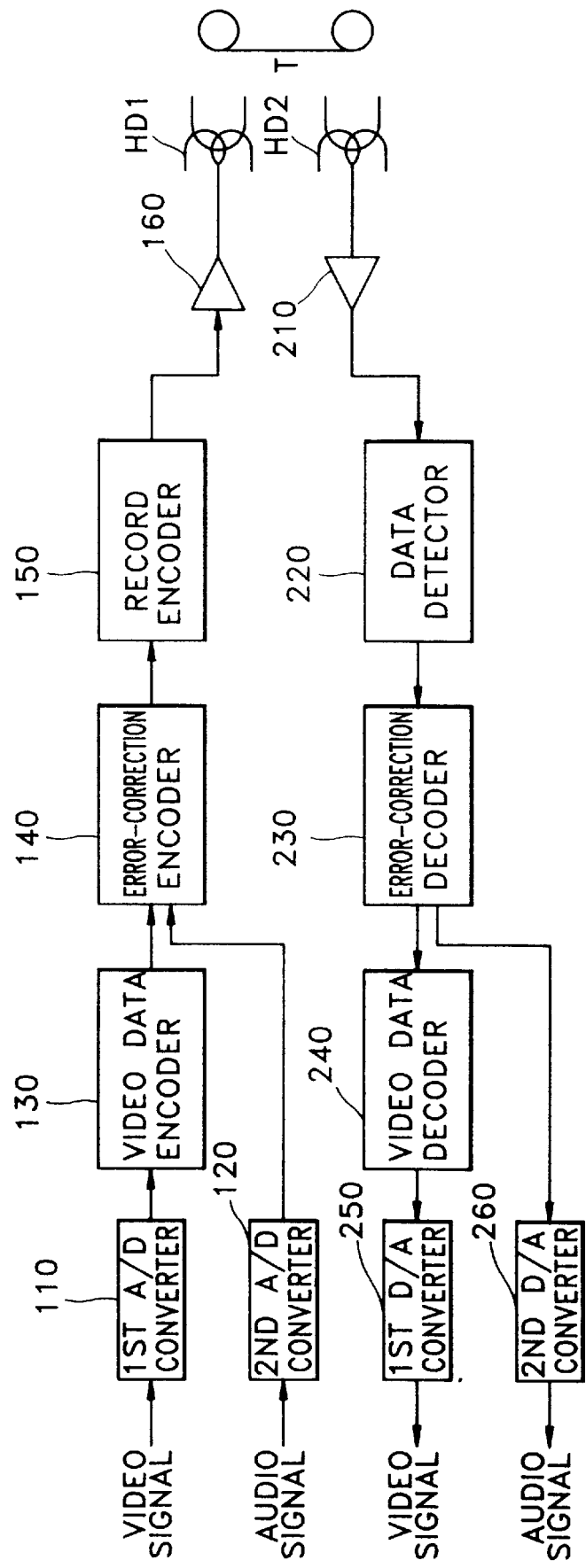
FIG. 1 is a diagram of a signal processing system in a digital videocassette recorder.
Figure 2:
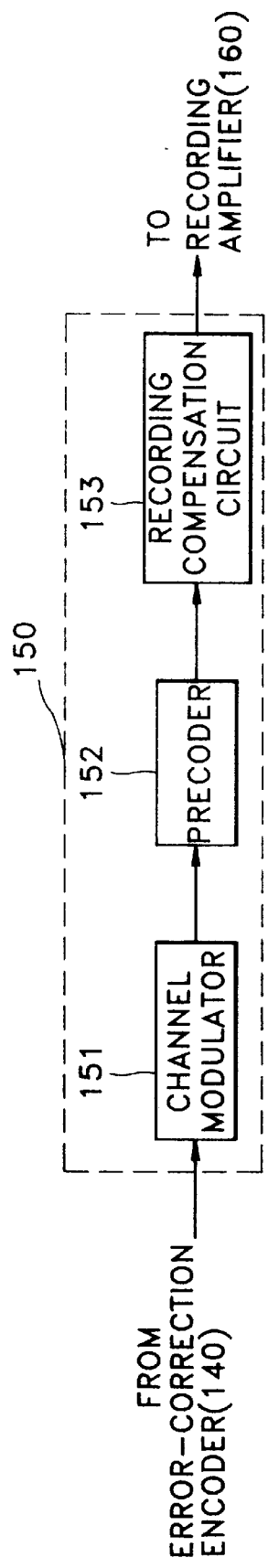
FIG. 2 is a diagram of the recording encoder shown in FIG. 1.
Figure 3:
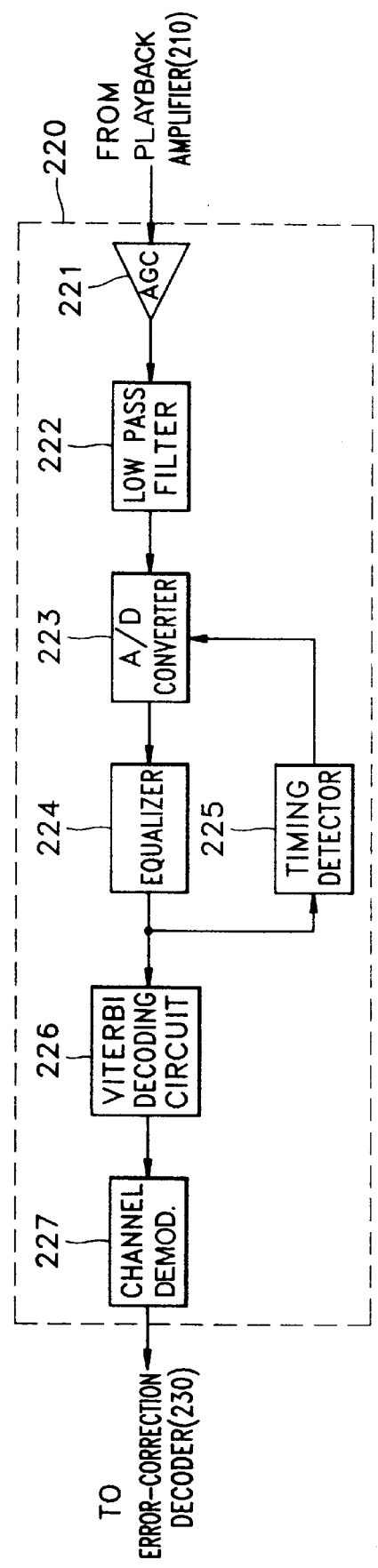
FIG. 3 is a diagram of the data detector shown in FIG. 1.
Figure 4A:
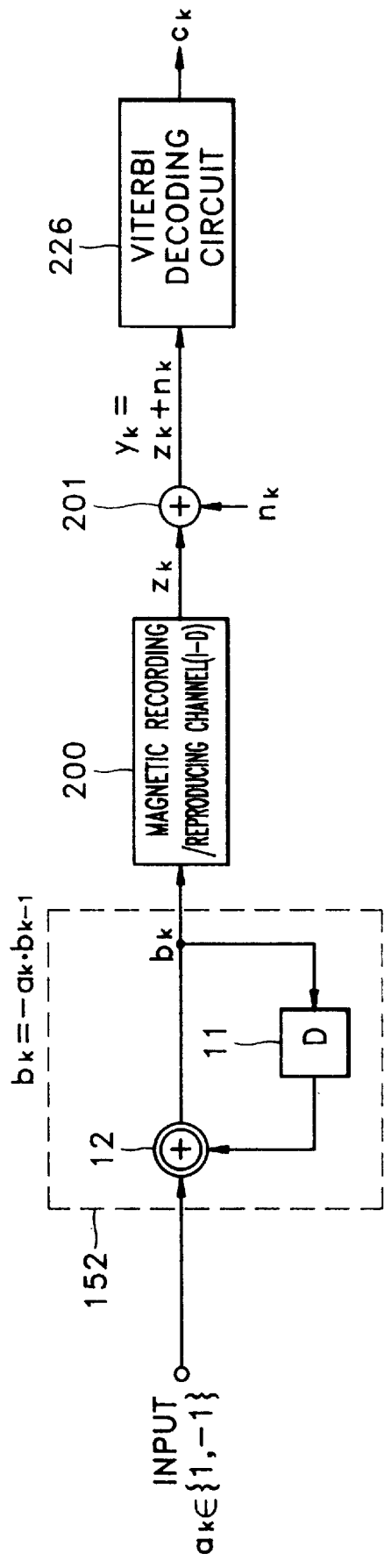
FIG. 4A is a diagram of a circuit which implements a Viterbi decoding process.
Figure 4B:
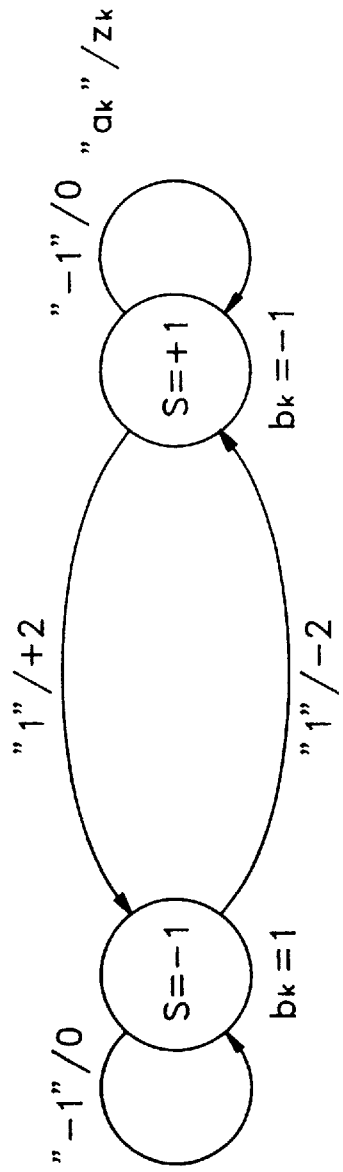
FIG. 4B is a state diagram of the precoder shown in FIG. 4A.
Figure 6A:
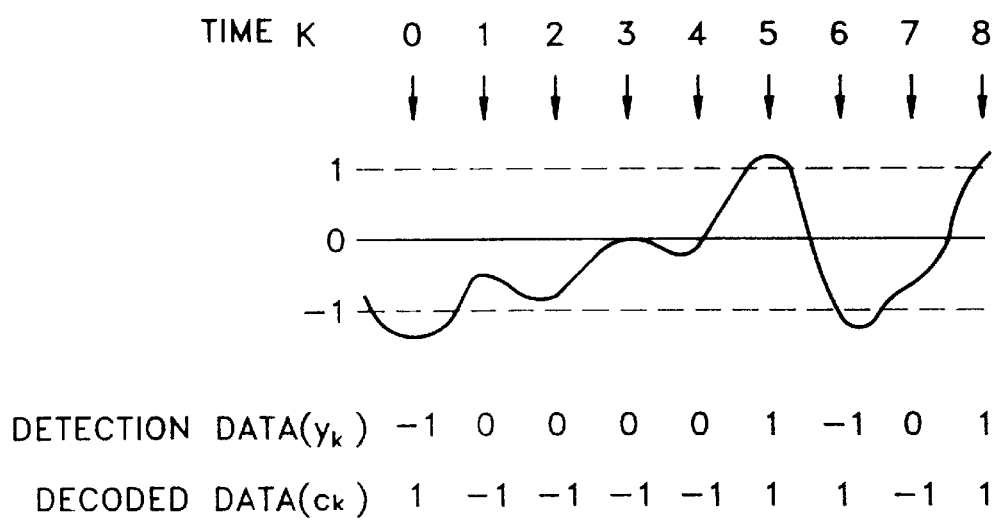
FIG. 6A is diagram showing the equalized signal input to the Viterbi decoding circuit shown in FIG. 3.
Figure 6B:
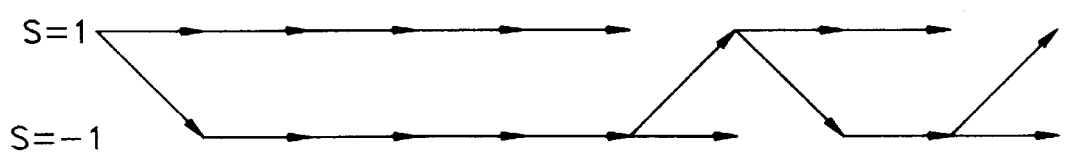
FIG. 6B is a trellis diagram for the Viterbi decoding circuit shown in FIG. 3.
Figure 9:
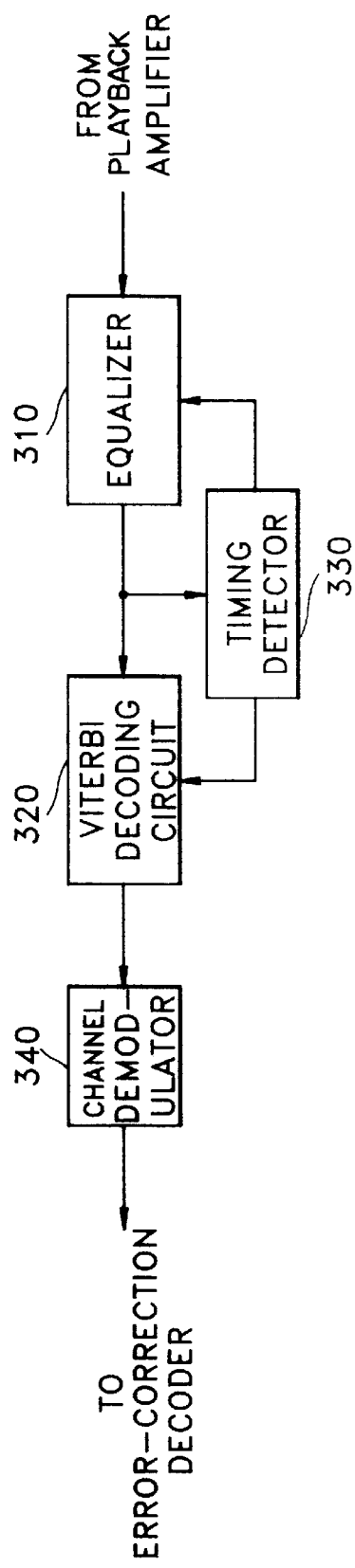
FIG. 9 is a diagram of a data detector in accordance with one embodiment of the present invention.

FIG. 9 is a diagram of the data detector employing a Viterbi decoding circuit in accordance with one embodiment of the present invention. In particular, the data detector comprises an equalizer 310, a Viterbi decoding circuit 320, a timing detector 330, and a channel demodulator 340. Furthermore, the data detector does not require an A/D converter, but the present invention can be incorporated in the data detector 220 shown in FIG. 3.

The equalizer 310 inputs an amplified signal reproduced from a playback amplifier, equalizes such signal, and outputs a corresponding equalized signal. Furthermore, the equalizer 310 may be either a fixed or adaptive type. The timing detector 330 detects the timing of the equalized signal and outputs driving clocks to the equalizer 310, the Viterbi decoding circuit 320, and possibly other components which are not shown in FIG. 9. The Viterbi decoding circuit 320 performs the Viterbi decoding operation on the equalized signal and outputs corresponding Viterbi-decoded data. The channel demodulator 340 demodulates the Viterbi-decoded data based on a particular modulation scheme and outputs corresponding channel demodulated data to an error-correction decoder.

Figure 10:
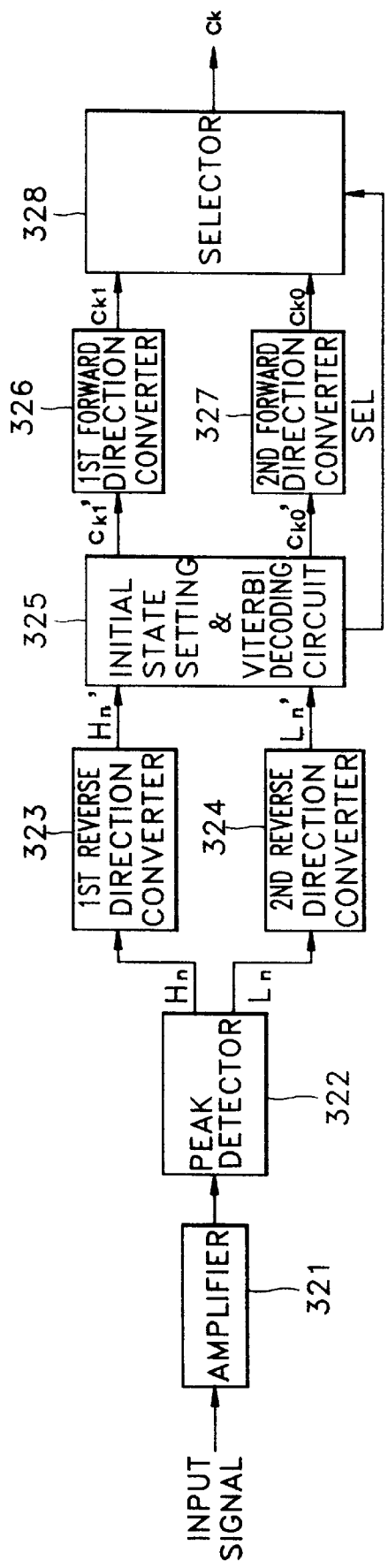
FIG. 10 is a diagram of a Viterbi decoding circuit in accordance with one embodiment of the present invention.

An example of the structure of the Viterbi decoding circuit 320 is shown in FIG. 10. Specifically, the circuit 320 comprises an amplifier 321, a peak detector 322, a first reverse direction converter 323, a second reverse direction converter 324, an initial state setting and Viterbi decoding circuit ("decoder") 325, a first forward direction converter 326, a second forward direction converter 327, and a selector 328.

The amplifier 321 inputs the equalized signal from the equalizer 310 and generates a related amplified signal. The peak detector 322 interlocks the positive and negative peak detection thresholds of the amplified signal such that the difference between such thresholds remains at a predetermined offset value A. While maintaining the difference between the thresholds, the peak detector 322 detects the positive and negative peak values of the amplified signal and outputs positive and negative peak data $H_n$ and $L_n$.

The first reverse direction converter 323 groups a predetermined number of bits (e.g., eight bits) of the positive peak data $H_n$ output from the peak detector 322. Then, the converter 323 performs a reverse direction conversion operation to reverse the order of the eight bits of the peak data $H_n$ to produce reverse positive peak data $H_n'$. Similarly, the second reverse direction converter 324 groups a predetermined number of bits (e.g., eight bits) of the negative peak data $L_n$ output from the peak detector 322. Afterwards, the converter 324 performs a reverse direction conversion is operation to reverse the order of the eight bits of the peak data $L_n$ to produce reverse negative peak data $L_n'$.

The decoder 325 inputs the reverse positive and negative peak data $H_n'$ and $L_n'$ and decodes such data $H_n'$ and $L_n'$ under the initial condition of the two possible states ($S_1=1$ and $S_0=-1$). Then, the decoder 325 generates reverse decoded data $c_{k1}'$ which corresponds to the state $S_1$ and generates reverse decoded data $c_{k0}'$ which corresponds to the state $S_0$. Furthermore, the decoder 325 outputs a selection control signal SEL based on the state of the initial decoded data of the next group following the final decoded data of the present group.

The first forward direction converter 326 inputs the reverse decoded data $c_{k1}'$ that was decoded by the decoder 325 under the initial condition of the state $S_1=1$. Then, the converter 326 reverses the order of the reverse decoded data $c_{k1}'$ to produce forward decoded data $c_{k1}$. Similarly, the second forward direction converter 327 inputs the reverse decoded data $c_{k0}'$ that was decoded by the decoder 325 under the initial condition of the state $S_0=-1$. Subsequently, the converter 327 reverses the order of the reverse decoded data $c_{k0}'$ to produce forward decoded data $c_{k0}$.

The selector 328 delays the forward decoded data $c_{k1}$ and $c_{k0}$ until the state of the initial decoded data of the next group is determined. Then, the selector 328 selects the appropriate forward decoded data $c_{k1}$ and $c_{k0}$ based on the state of the initial decoded data of the next group. Specifically, the decoder 325 determines such state and outputs the selection control signal SEL to identify such determination. Then, the selector 328 outputs one of the forward decoded data $c_{k1}$ or $c_{k0}$ as the output decoded data $c_k$ based on the signal SEL.

Figure 7A:
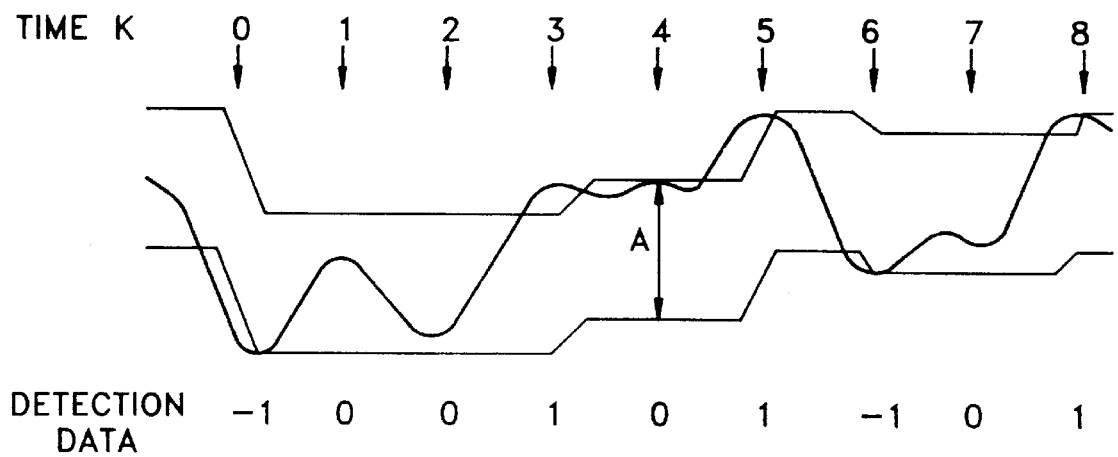
FIG. 7A is a diagram illustrating the equalized signal input to the Viterbi decoding circuit and a process for correcting the resultant detection data when noise is superposed on the equalized signal.
Figure 7B:
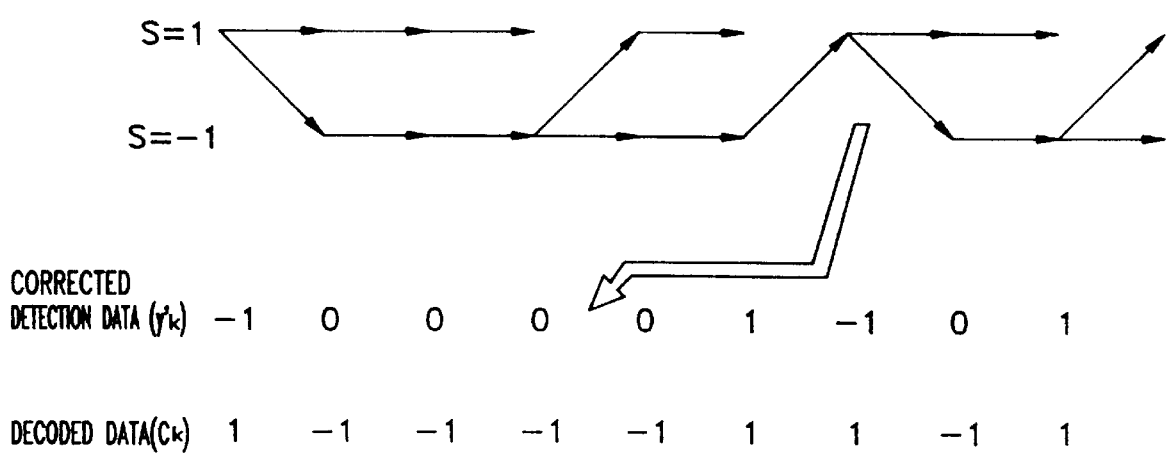
FIG. 7B is a trellis diagram for the Viterbi decoding circuit for showing an error correction process.
Figure 8:
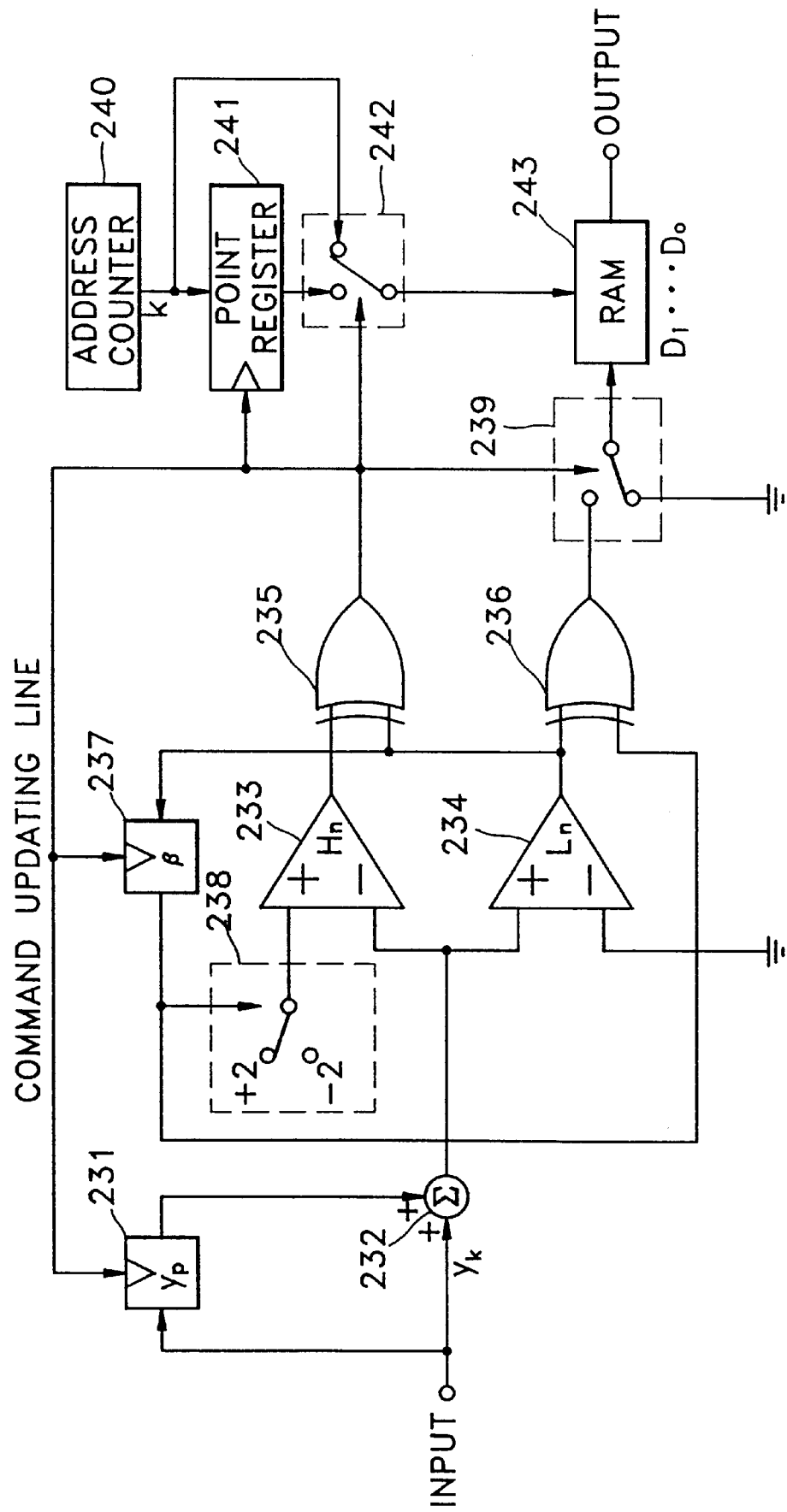
FIG. 8 is a diagram of a conventional Viterbi decoding circuit.

As shown in the trellis diagram illustrated in FIG. 5C, when the channel output $y_k$ is decoded from left to right (forward direction), calculating the metric value at each divergent point is necessary to determine the surviving path at each divergent point. Thus, a microprocessor is needed to compute the metric values of various paths at each divergent point. On the other hand, when the Viterbi decoding is performed from right to left (reverse direction) on the trellis diagram, the need to determine the surviving path at each divergent point is no longer necessary since only one path exists which enables one to travel from the right to the left of the diagram. Accordingly, calculating numerous metric values at each point is unnecessary. For example, as shown in the trellis diagram in FIG. 7B, if the signal is sequentially decoded from the time k=7 to the time k=0, the correct data can be precisely determined.

When the channel output $y_k$ is decoded in the reverse direction, the metric value at each state must be checked. However, if the positive peaks and the negative peaks of the output $y_k$ are detected, computing the metric value at each divergent point via a microprocessor is unnecessary because the detection of the positive and negative peaks naturally corresponds to the metrics of the output $y_k$. Accordingly, if the instantaneous values of the positive and negative peaks are detected and are deemed to correspond to the metric values and if such instantaneous values are stored as positive peak data $H_n$ and negative peak data $L_n$, the correct path on the trellis diagram can be determined.

For instance, when the channel output $y_k$ is initially decoded, the first segment of the output $y_k$ (e.g., the segment k=0 to k=7) is output to the peak detector 322 in which the positive and negative peak data $H_n$ and $L_n$ are determined. Afterwards, the converters 323 and 324 reverse the order of the data $H_n$ and $L_n$ to produce reverse positive and negative peak data $H_n'$ and $L_n'$. Then, the data $H_n'$ and $L_n'$ are output to the decoder 325, and the decoder decodes the data $H_n'$ and $L_n'$ in the reverse order. In other words, the decoder 325 determines the state S(k) of the channel output $y_k$ based on the reverse positive and negative peak data $H_n'$ and $L_n'$ beginning with the data $H_n'$ and $L_n'$ corresponding to the time k=7 and ending with the data $H_n'$ and $L_n'$ corresponding to the time k=0.

However, since the value of the state S(7) at the time k=7 depends upon the value of the state S(8) at the time k=8, the decoder 325 is unable definitely determine the value of the state S(7) because the reverse positive and negative peak data $H_n'$ and $L_n'$ for the next segment of the output $y_k$ (i.e., the segment k=8 to k=15) has not yet been processed. Accordingly, the decoder 325 generates reverse decoded data $c_{k1}'$ corresponding to the situation in which the state S(8) equals $S_1$ (i.e., "1") and simultaneously generates reverse decoded data $c_{k0}'$ corresponding to the situation in which the state S(8) equals $S_0$ (i.e., "−1").

The reverse decoded data $c_{k1}'$ and $c_{k0}'$ are respectively input to shift registers in the first and second forward direction converters 326 and 327. Then, the converters 326 and 327 respectively reverse the order of the data $c_{k1}'$ and $c_{k0}'$ to produce forward decoded data $c_{k1}$ and $c_{k0}$. Subsequently, the selector 328 delays the data $c_{k1}$ and $c_{k0}$ in parallel until the decoder 325 determines the state S(8). When the state S(8) is determined, the decoder 325 outputs the selection control signal SEL depending upon the state S(8), and the selector 328 outputs the correct forward decoded data $c_{k1}$ or $c_{k0}$ as the output decoded data $c_k$.

Figure 11:
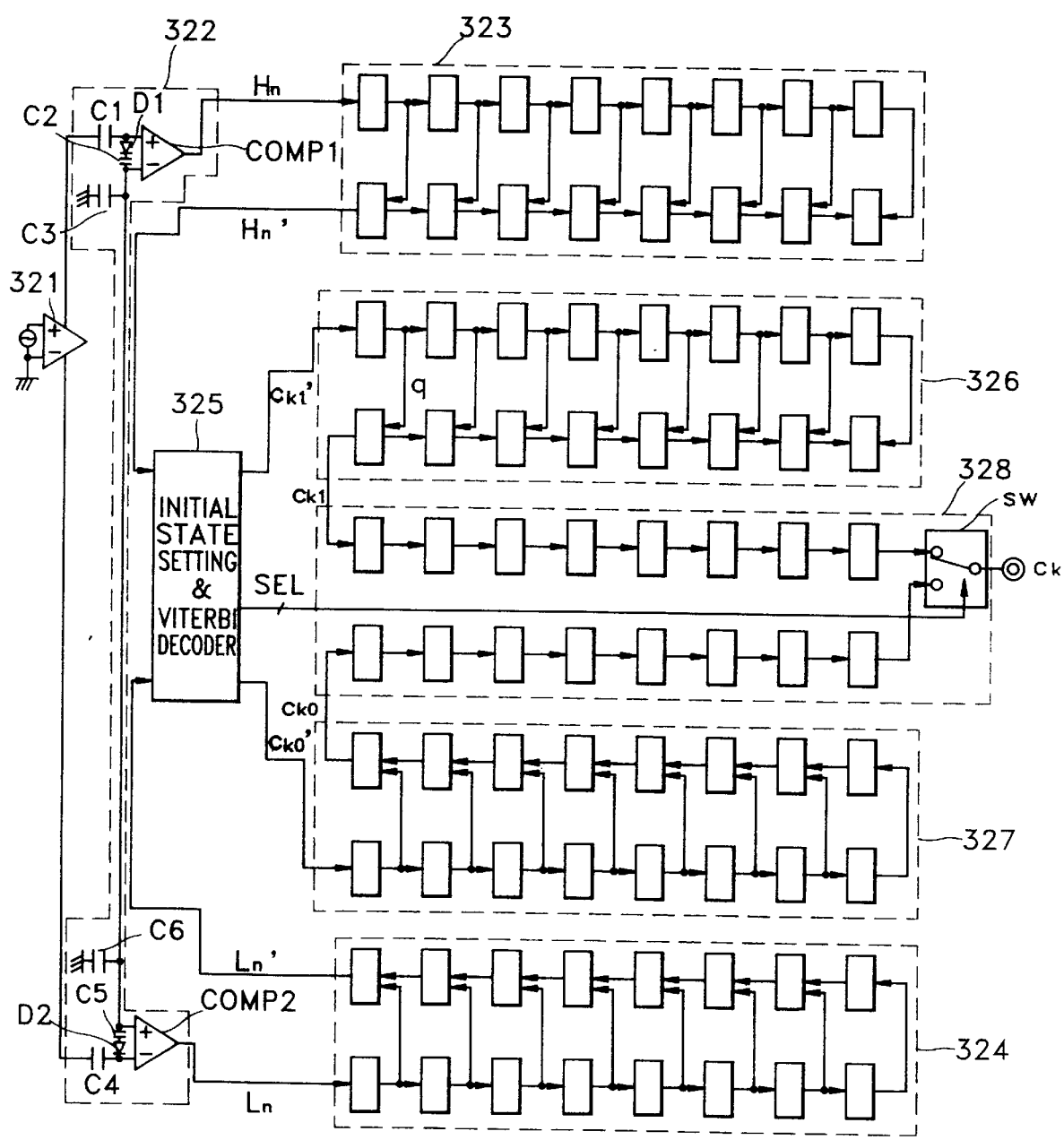
FIG. 11 is a diagram of an example of a detailed circuit diagram of the Viterbi decoding circuit shown in FIG. 10.

A more detailed example of the construction of the Viterbi decoding circuit 320 shown in FIG. 10 will be described in conjunction with FIG. 11. The amplifier 321 is a buffering amplifier that amplifies the equalized signal to a predetermined level and outputs the amplified signal to the peak detector 322.

The peak detector 322 comprises comparators COMP1 and COMP2, capacitors C1 to C6, and diodes D1 and D2. The comparator COMP1 contains a non-inverting input which is connected to the output port of the amplifier 321 via the capacitor C1 and is connected to the anode of the diode D1. The comparator COMP1 also includes an inverting input which is connected to the cathode of the diode D1 via the capacitor C2 and is connected to ground via the capacitor C3. Similarly, the comparator COMP2 contains an inverting input which is connected to the output port of the amplifier 321 via the capacitor C4 and is connected to the cathode of the diode D2. The comparator COMP2 also includes a non-inverting input which is connected to the anode of the diode D2 via the capacitor C5 and is connected to ground via the capacitor C6. Furthermore, the non-inverting input of the comparator COMP2 is connected to the inverting input of the comparator COMP1.

Based on the configuration above, the comparator COMP1 generates the positive peak data $H_n$ based on the amplified signal output from the amplifier 321, and the comparator COMP2 generates the negative peak data $L_n$ based on the amplified signal. In addition, the detector 322 interlocks the thresholds by which the positive and negative peaks are detected and maintains the difference between the two thresholds at a predetermined offset A. Accordingly, the positive and negative peaks of the equalized signal are stabilized.

The first reverse detection converter 323 is formed of two 8-bit shift registers for converting the positive peak data $H_n$ output from the peak detector 322 into reverse positive peak data $H_n'$. For example, as illustrated in FIG. 11, the converter 323 comprises a serial-input/parallel-output (SIPO) 8-bit shift register which inputs the data $H_n$ and outputs data to a parallel-input/serial output (PISO) 8-bit shift register. Then, the PISO 8-bit shift register outputs the data $H_n'$. Similarly, the second reverse detection converter 324 is formed of two 8-bit shift registers for converting the negative peak data $L_n$ output from the peak detector 322 into reverse negative peak data $L_n'$. As illustrated in the figure, the converter 324 contains a SIPO 8-bit shift register which inputs the data $L_n$ and outputs data to a PISO 8-bit shift register. Afterwards, the PISO 8-bit shift register outputs the data $L_n'$. The decoder 325 inputs the data $H_n'$ and $L_n'$ and generates the reverse decoded data $c_{k1}'$ and $c_{k0}'$.

The first forward direction converter 326 is formed of two 8-bit shift registers for converting the reverse decoded data $c_{k1}'$ into the forward decoded data $c_{k1}$. Specifically, the converter 326 may include a SIPO 8-bit shift register which inputs the data $c_{k1}'$ and outputs data to a PISO 8-bit shift register. Then, the PISO 8-bit shift register outputs the forward decoded data $c_{k1}$. Similarly, the second forward direction converter 327 is formed of two 8-bit shift registers for converting the reverse decoded data $c_{k0}'$ into the forward decoded data $c_{k0}$. In particular, the converter 327 may comprise a SIPO 8-bit shift register which inputs the data $c_{k0}'$ and outputs data to a PISO 8-bit register. Then, the PISO 8-bit shift register outputs the forward decoded data $c_{k0}$.

The selector 328 comprises a first SIPO 8-bit shift register, a second SIPO 8-bit shift register, and a switch SW. The first SIPO 8-bit shift register delays the forward decoded data $c_{k1}$, and the second SIPO 8-bit shift register delays the forward decoded data $c_{k0}$. Afterwards, the switch SW outputs the data $c_{k1}$ or $c_{k0}$ as the final output decoded data $c_k$ depending upon the value of the selection control signal SEL.

Figure 12:
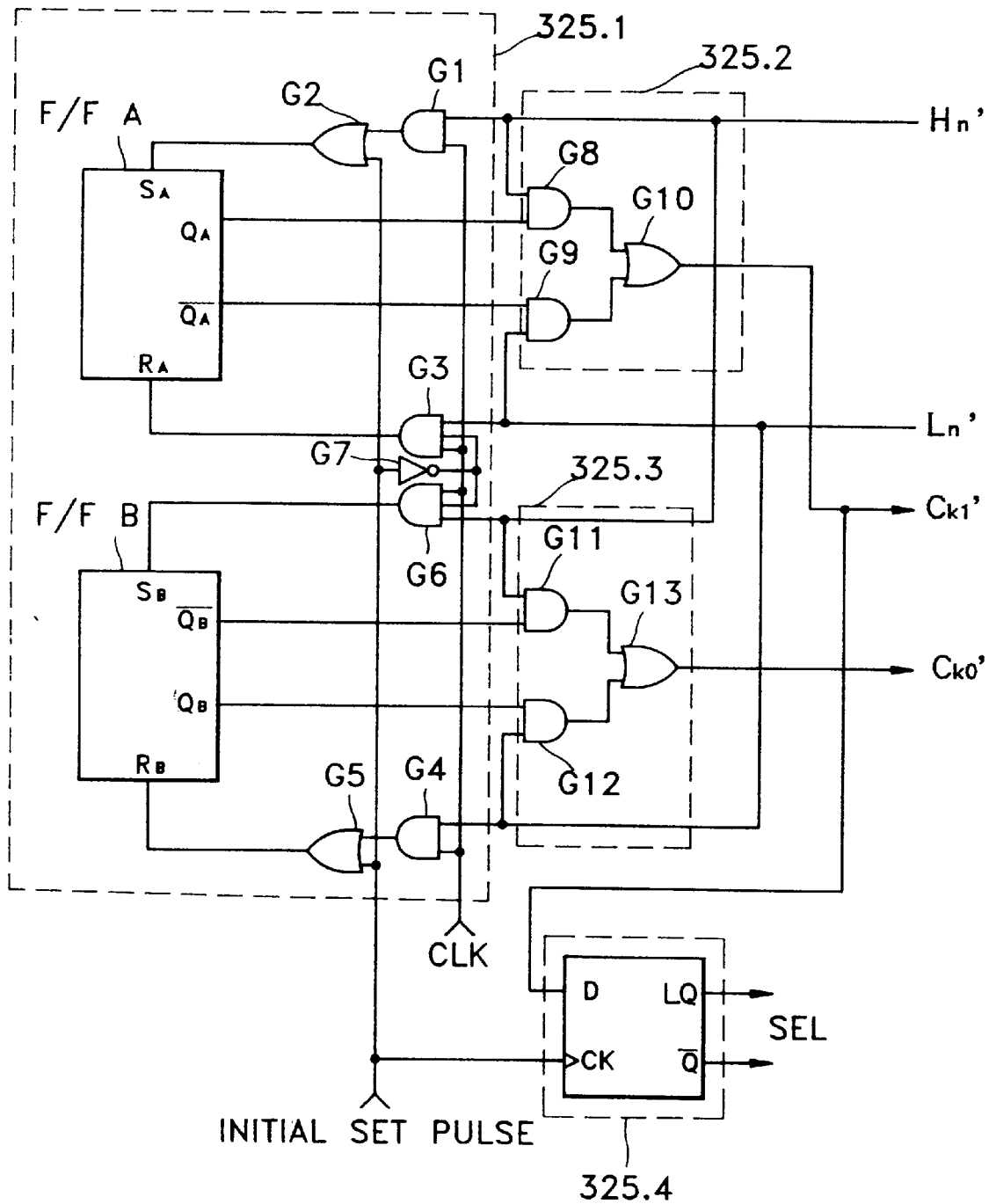
FIG. 12 is a diagram of an example of a detailed circuit diagram of an initial state value setting and Viterbi decoding circuit shown in FIG. 11.

A more detailed embodiment of the decoder 325 is illustrated in FIG. 12. Specifically, the decoder 325 comprises an initial state setting circuit 325.1, a first Viterbi logic circuit 325.2, a second Viterbi logic circuit 325.3, and a selection control signal generating circuit 325.4.

The initial state setting circuit 325.1 comprises a first RS flip-flop A, a second RS flip-flop B, AND gates G1, G3, G4, and G6, OR gates G2 and G5, and an inverter G7. The AND gate G1 inputs the reverse positive peak data $H_n'$ and a clock signal CLK, performs an AND operation on such signals $H_n'$ and CLK, and outputs a first ANDed signal. The OR gate G2 inputs the first ANDed signal and an initial set pulse, performs an OR operation on such signals, and outputs a first ORed signal. The inverter G7 inputs the initial set pulse and inverts such signal to produce a first inverted signal. The AND gate G3 inputs the first inverted signal, the reverse negative peak data $L_n'$, and the clock signal CLK, performs an AND operation on such signals, and outputs a second ANDed signal.

The AND gate G4 inputs the reverse negative peak data $L_n'$ and the clock signal CLK, performs an AND operation on such signals $L_n'$ and CLK, and outputs a third ANDed signal. The OR gate G5 inputs the third ANDed signal and the initial set pulse, performs an OR operation on such signals, and outputs a second ORed signal. The AND gate G6 inputs the first inverted signal, the reverse positive peak data $H_n'$, and the clock signal CLK, performs an AND operation on such signals, and outputs a fourth ANDed signal.

The first RS flip-flop A inputs the first ORed signal via its set input $S_A$ and inputs the second ANDed signal via its reset input $R_A$. Then, the flip-flop A outputs a set signal $Q_A$ and an inverted set signal $Q_A\backslash$ based on such input signals. The second RS flip-flop B inputs the second ORed signal via its reset input $R_B$ and inputs the fourth ANDed signal via its set input $S_B$. Then, the flip-flop B outputs a set signal $Q_B$ and an inverted set signal $Q_B\backslash$ in accordance with such input signals.

The first Viterbi logic circuit 325.2 comprises AND gates G8 and G9 and an OR gate G10. The AND gate G8 inputs the reverse positive peak data $H_n'$ and the set signal $Q_A$, performs an AND operation on such signals $H_n'$ and $Q_A$, and outputs a fifth ANDed signal. The AND gate G9 inputs the reverse negative peak data $L_n'$ and the inverted set signal $Q_A\backslash$, performs an AND operation on such signals $L_n'$ and $Q_A\backslash$, and outputs a sixth ANDed signal. The OR gate inputs the fifth and sixth ANDed signals, performs an OR operation on the ANDed signals, and outputs the reverse decoded data $c_{k1}'$.

The second Viterbi logic circuit 325.3 comprises AND gates G11 and G12 and an OR gate G13. The AND gate G11 inputs the reverse positive peak data $H_n'$ and the inverted set signal $Q_B\backslash$, performs an AND operation on such signals $H_n'$ and $Q_B\backslash$, and outputs a seventh ANDed signal. The AND gate G12 inputs the reverse negative peak data $L_n'$ and the set signal $Q_B$, performs an AND operation on such signals $L_n'$ and $Q_B$, and outputs an eighth ANDed signal. The OR gate inputs the seventh and eighth ANDed signals, performs an OR operation on the ANDed signals, and outputs the reverse decoded data $c_{k0}'$.

The selection control signal generating circuit 325.4 comprises a D flip-flop C. In particular, the D flip-flop C inputs the reverse decoded data $c_{k1}'$ via its D input and inputs the initial set pulse via its clock input CK. Then, the flip-flop C outputs the selection control signal SEL based on such input signals.

The first RS flip-flop A corresponds to the state $S_1$, and the second RS flip-flop B corresponds to the state $S_0$. Furthermore, the initial set pulse initially sets the outputs of the flip-flops A and B to the initial values of their respective states $S_1$ and $S_0$. Specifically, the initial set pulse is input by the set input $S_A$ of the flip-flop A (via the OR gate G2) and causes the set signal $Q_A$ to equal the value "H". On the other hand, the initial set pulse is input by the reset input $R_B$ of the flip-flop B (via the OR gate G5) and causes the set signal $Q_B$ to equal the value "L". In the present embodiment, the initial set pulse corresponds to a byte pulse generated by an 8-bit period. Also, the inverter G7 inputs the input set pulse and outputs an inverted pulse to the AND gate G3 so that a logic high state is not simultaneously applied to the set input $S_A$ and the reset input $R_A$ of the flip-flop A. Similarly, the inverter G7 outputs the inverted pulse to the AND gate G6 so that a logic high state is not simultaneously applied to the set input $S_B$ and the reset input $R_B$ of the flip-flop B.

As shown in FIG. 12, the reverse positive peak data $H_n'$ is supplied to the set inputs $S_A$ and $S_B$ in accordance with the clock signal CLK. Specifically, the data $H_n'$ is output to the input $S_A$ of the flip-flop A via the AND gate G1 and the OR gate G2 and is output to the input $S_B$ of the flip-flop B via the AND gate G6. Also, the reverse negative peak data $L_n'$ is output to the reset inputs $R_A$ and $R_B$ in synchronicity with the clock is signal CLK. In particular, the data $L_n'$ is output to the input $R_A$ of the flip-flop A via the AND gate G3 and is output to the input $R_B$ of the flip-flop B via the AND gate G4 and the OR gate G5.

As illustrated above, the reverse decoded data $c_{k1}'$ is generated under the assumption that the initial state of the equalized signal is equal to the state $S_1$. On the other hand, the reverse decoded data $c_{k0}'$ is generated under the assumption that the initial state of the equalized signal is equal to the state $S_0$.

Also, the initial setting pulse and the clock signal CLK are generated by a signal generator (not shown) based on a driving clock signal output from the timing detector (FIG. 9). Alternatively, the timing detector may generate such signals itself.

In order to facilitate an understanding of the operation of the components shown in FIGS. 11 and 12, an example of the decoding process will be described below in conjunction with the input signal (i.e., channel output $y_k$). The channel output $y_k$ may be segmented into groups of eight bits, and each group may be sequentially processed. For example, a first group may contain the data ($y_0$, $y_1$, $y_2$, $y_3$, $y_4$, $y_5$, $y_6$, $y_7$), a second group may contain the data ($y_8$, $y_9$, $y_{10}$, $y_{11}$, $y_{12}$, $y_{13}$, $y_{14}$, $y_{15}$), a third group may contain the data ($y_{16}$, $y_{17}$, $y_{18}$, $y_{19}$, $y_{20}$, $y_{21}$, $y_{22}$, $y_{23}$), etc.

The first group of data ($y_0$, $y_1$, $y_2$, $y_3$, $y_4$, $y_5$, $y_6$, $y_7$) may be amplified by the amplifier 321, and the positive and negative peak data $H_n$ and $L_n$ corresponding to the data ($y_0$, $y_1$, $y_2$, $y_3$, $y_4$, $y_5$, $y_6$, $y_7$) is generated by the peak detector 322. Afterwards, the first reverse direction converter 323 reverses the order of the data $H_n$ to produce the reverse positive peak data $H_n'$. In other words, the data $H_n$ is arranged such that it sequentially corresponds to the data ($y_0$, $y_1$, $y_2$, $y_3$, $y_4$, $y_5$, $y_6$, $y_7$), and the data $H_n'$ is ordered such that it sequentially relates to the reversed first group of data ($y_7$, $y_6$, $y_5$, $y_4$, $y_3$, $y_2$, $y_1$, $y_0$). Similarly, the second reverse direction converter 324 reverses the order of the data $L_n$ to produce the reverse positive peak data $L_n'$. Thus, the data $L_n$ is arranged such that it sequentially corresponds to the data ($y_0$, $y_1$, $y_2$, $y_3$, $y_4$, $y_5$, $y_6$, $y_7$), and the data $L_n'$ is ordered such that it sequentially relates to the reversed first group of data ($y_7$, $y_6$, $y_5$, $y_4$, $y_3$, $y_2$, $y_1$, $y_0$).

Then, the decoder 325 decodes the reverse positive peak data $H_n'$ and the reverse negative peak data $L_n'$ and outputs the reverse decoded data $c_{k1}'$ and $c_{k0}'$. Specifically, the decoder 325 sequentially outputs the data $c_{k1}'$ and $c_{k0}'$ corresponding to the reversed first group of data ($y_7$, $y_6$, $y_5$, $y_4$, $y_3$, $y_2$, $y_1$, $y_1$), the reversed second group of data ($y_{15}$, $y_{14}$, $y_{13}$, $y_{12}$, $y_{11}$, $y_{10}$, $y_9$, $y_8$), the reversed third group of data ($y_{23}$, $y_{22}$, $y_{21}$, $y_{20}$, $y_{19}$, $y_{18}$, $y_{17}$, $y_{16}$), etc. Subsequently, the first and second forward detection converters 326 and 327 input and reverse the order of the data $c_{k1}'$ and $c_{k0}'$ to produce the forward decoded data $c_{k1}$ and $c_{k0}$. Furthermore, the forward decoded data $c_{k1}$ and $c_{k0}$ sequentially correspond to the first group of data ($y_0$, $y_1$, $y_2$, $y_3$, $y_4$, $y_5$, $y_6$, $y_7$), the second group of data ($y_8$, $y_9$, $y_{10}$, $y_{11}$, $y_{12}$, $y_{13}$, $y_{14}$, $y_{15}$), the third group of data ($y_{16}$, $y_{17}$, $y_{18}$, $y_{19}$, $y_{20}$, $y_{21}$, $y_{22}$, $y_{23}$), etc.

As described previously, the state $S(8)$ of the input signal $y_k$ at the time k=8 is determined by the decoder 325 when the data $H_n'$ and $L_n'$ relating to the reversed second group of data ($y_{15}$, $y_{14}$, $y_{13}$, $y_{12}$, $y_{11}$, $y_{10}$, $y_9$, $y_8$) has been decoded by the decoder 325 and the corresponding data $c_{k1}'$ and $c_{k0}'$ are being input to the converters 326 and 327. Since the value of the state $S(8)$ is needed to determine whether the forward decoded data $c_{k1}$ or $c_{k0}$ relates to the correct state of the first group of data ($y_0$, $y_1$, $y_2$, $y_3$, $y_4$, $y_5$, $y_6$, $y_7$), such data $c_{k1}$ and $c_{k0}$ is delayed in the selector 328 until the state $S(8)$ is determined by the decoder 325.

When the second group of data is decoded, the states $S(15)$ in the decoded data $c_{k1}'$ and $c_{k0}'$ are different from each other. However, the other data $y_8$, $y_9$, $y_{10}$, $y_{11}$, $y_{12}$, $y_{13}$, and $y_{14}$ in the decoded data $c_{k1}'$ and $c_{k0}'$ are the same, respectively. Thus, when the decoded data of the second group are input to the SIPO registers in the converters 326 and 327, the state $S(8)$ can be determined.

After such state $S(8)$ has been determined, the decoder 325 outputs the selection control signal SEL to inform the selector 328 which data $c_{k1}$ and $c_{k0}$ is the correct data to output as the output decoded data $c_k$ for the first group.

As described above, a time delay occurs during the Viterbi decoding process since the output decoded data $c_k$ for the first group of data ($y_0$, $y_1$, $y_2$, $y_3$, $y_4$, $y_5$, $y_6$, $y_7$) is delayed until the state of the second group of data ($y_8$, $y_9$, $y_{10}$, $y_{11}$, $y_{12}$, $y_{13}$, $y_{14}$, $y_{15}$) is determined. Also, in the above example, the groups of data contain 8-bits of data which are processed in the reverse direction, and thus, the state $S(8)$ is determined in the last of three periods. Afterwards, the first forward decoded data $c_{k1}$ is output when the initial state of the state S(8) equals $S_1$, and the second forward decoded data $c_{k0}$ is output when the initial state of the state S(8) equals $S_0$. Accordingly, a delay of 24 bits (8 bits×3) is experienced.

However, if the clock frequency of the shift registers in the converters 323, 324, 326, and 327 is increased, the time delay may be reduced. On the other hand, the number of bits in each groups is determined according to a digital modulation scheme. In particular, the number of bits of each group should be determined based on a predetermined runlength limit (RLL) value.

As described above, when the states are binary (S=1 or S=−1) and the decoding circuit is a partial response type PR(1, −1), PR(1, 1) or PR(1, 0, 1) system, the decoding s circuit preferably contains a shift register which receives positive and negative peak data. As a result, the decoding circuit can be created without using an A/D converter or a microprocessor, and thus, the size and manufacturing cost of an integrated circuit comprising the decoder can be reduced.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed is:

1. A Viterbi decoding method for demodulating a reproduced signal in a magnetic recording/reproducing apparatus comprising the steps of:
    (a) grouping said reproduced signal into at least a current reproduced signal group and a subsequent reproduced signal group in accordance with predetermined time segments;
    (b) comparing said current reproduced signal group with a positive peak threshold to obtain positive peak data in a positive amplitude direction and comparing said current reproduced signal group with a negative peak threshold to obtain negative peak data in a negative amplitude direction;
    (c) Viterbi-decoding said positive peak data and said negative peak data to produce a current positive-peak decoded data group and a current negative-peak decoded data groups respectively; and
    (d) concatenating a final portion of decoded data within a particular current decoded data group and an initial portion of decoded data corresponding to said subsequent reproduced signal group to generate output decoded data.

2. A Viterbi decoding method as claimed in claim 1, wherein said step (d) comprises the steps of:
    (d1) determining a state of said initial portion of decoded data corresponding to said subsequent reproduced signal group; and
    (d2) selecting said particular current decoded data group based on said state; and
    (d3) concatenating said final portion of decoded data within said particular current decoded data group and said initial portion of decoded data corresponding to said subsequent reproduced signal group.

3. A Viterbi decoding method as claimed in claim 2, wherein said step (c) further comprises the step of:

(c4) delaying said current decoded data groups until said state of said initial portion of decoded data corresponding to said subsequent reproduced signal group is determined.

4. A Viterbi decoding method as claimed in claim 1, wherein a number of bits in said current reproduced signal group is determined by a digital modulation method.

5. A Viterbi decoding method for demodulating a reproduced signal in a magnetic recording/reproducing apparatus comprising the steps of:
    (a) grouping said reproduced signal into at least a current reproduced signal group and a subsequent reproduced signal group in accordance with predetermined time segments;
    (b) comparing said current reproduced signal group with a positive peak threshold to obtain positive peak data in a positive amplitude direction and comparing said current reproduced signal group with a negative peak threshold to obtain negative peak data in a negative amplitude direction;
    (c) Viterbi-decoding said positive peak data and said negative peak data to produce current decoded data groups; and
    (d) concatenating a final portion of decoded data within a particular current decoded data group and an initial portion of decoded data corresponding to said subsequent reproduced signal group to generate output decoded data, wherein said step (c) comprises the steps of:
       (c1) converting said positive peak data in a reverse direction to produce reverse positive peak data and converting said negative peak data in said reverse direction to produce reverse negative peak data.

6. A Viterbi decoding method for decoding an input signal comprising the steps of:
    (a) grouping said input signal into at least a current input data group and a subsequent input data group in accordance with predetermined time segments;
    (b) detecting negative peak data values and positive peak data values for said current input data group, wherein said negative peak data values and said positive peak data values are instantaneous values;
    (c) converting said positive peak data values in a reverse direction to produce reverse positive peak data and converting said negative peak data values in said reverse direction to produce reverse negative peak data;
    (d) Viterbi-decoding said reverse positive peak data and said reverse negative peak data with respect to a predetermined number of initial states and generating current reverse decoded data groups which respectively correspond to a plurality of output data streams and which respectively correspond to said predetermined number of initial states;
    (e) converting said current reverse decoded data groups in a forward direction to produce current forward decoded data groups for said output data streams, respectively; and
    (f) selecting a particular current forward decoded data group corresponding to a particular output data stream based on a state of initial decoded data corresponding to said subsequent input data group.

7. A Viterbi decoding method as claimed in claim 6, wherein said step (f) comprises the step of:
    (f1) delaying said current forward decoded data groups for said output data streams until said state of said initial decoded data is determined.

8. A Viterbi decoding method as claimed in claim 6, wherein said predetermined number of initial states is two and said plurality of output data streams are two output data streams.

9. A Viterbi decoding method as claimed in claim 6, wherein a number of bits in said current input data group is determined by a digital modulation method.

10. A Viterbi decoding circuit for decoding an input signal comprising:

- detecting means for detecting negative peak data values and positive peak data values from a current input signal group, wherein said input signal is grouped into at least said current input signal group and a subsequent input signal group in accordance with predetermined time segments and wherein said negative peak data values and said positive peak data values are instantaneous values;
- first converting means for converting said positive peak data in a reverse direction to produce reverse positive peak data and for converting said negative peak data in said reverse direction to produce reverse negative peak data;
- Viterbi-decoding means for Viterbi-decoding said reverse positive peak data and said reverse negative peak data with respect to a predetermined number of initial states and generating current reverse decoded data groups which respectively correspond to a plurality of output data streams and which respectively correspond to said predetermined number of initial states, wherein said Viterbi decoding means generates a selection control signal based on a state of initial decoded data corresponding to said subsequent input signal group;
- second converting means for converting said current reverse decoded data groups in a forward direction to produce current forward decoded data groups for said output data streams, respectively; and
- selecting means for selecting a particular current forward decoded data group for a particular output data stream based on said selection control signal.

11. A Viterbi decoding circuit as claimed in claim 10, wherein said selecting means delays said current forward decoded data groups until said selection control signal is received.

12. A Viterbi decoding circuit as claimed in claim 10, wherein said predetermined number of initial states is two and said plurality of output data streams are two output data streams.

13. A Viterbi decoding circuit as claimed in claim 10, wherein said first converting means comprises a serial-input/parallel-output type shift register memory and a parallel-input/serial-output type shift register memory.

14. A Viterbi decoding circuit as claimed in claim 10, wherein said second converting means comprises a serial-input/parallel-output type shift register memory and a parallel-input/serial-output type shift register memory.

15. A Viterbi decoding circuit as claimed in claim 10, wherein said Viterbi decoding means comprises:

- an initial state setting circuit for setting a plurality of initial states corresponding to said current reverse decoded data groups, respectively;
- a first decoding logic circuit for performing a logic operation with respect to a first initial state, said reverse positive peak data, and said reverse negative peak data and for outputting a first current reverse decoded data group;
- a second decoding logic circuit for performing a logic operation with respect to a second initial state, said reverse positive peak data, and said reverse negative peak data and for outputting a second current reverse decoded data group; and
- a selection control signal generating circuit for generating said selection control signal based on said state of said initial decoded data corresponding to said subsequent input signal group.

16. A Viterbi decoding circuit as claimed in claim 10, wherein said selecting means comprises:

- a plurality of shift registers for respectively delaying said current forward decoded data groups until said selection control signal is generated; and
- a switching device for selecting said particular current forward decoded data group corresponding to said particular output data stream according to said selection control signal.

17. A Viterbi decoding circuit as claimed in claim 10, wherein a number of bits in said current input signal group is determined by a digital modulation method.

18. A Viterbi decoding method for demodulating a reproduced signal in a magnetic recording/reproducing apparatus comprising the steps of:

(a) grouping said reproduced signal into at least a current reproduced signal group and a subsequent reproduced signal group in accordance with predetermined time segments;

(b) comparing said current reproduced signal group with a positive peak threshold to obtain positive peak data in a positive amplitude direction and comparing said current reproduced signal group with a negative peak threshold to obtain negative peak data in a negative amplitude direction;

(c) Viterbi-decoding said positive peak data and said negative peak data to produce current decoded data groups; and (d) concatenating a final portion of decoded data within a particular current decoded data group and an initial portion of decoded data corresponding to said subsequent reproduced signal group to generate output decoded data, wherein said step (c) comprises the steps of:

(c1) converting said positive peak data in a reverse direction to produce reverse positive peak data and converting said negative peak data in said reverse direction to produce reverse negative peak data;

(c2) Viterbi-decoding said reverse positive peak data and said reverse negative peak data with respect to a plurality of initial states and outputting current reverse decoded data groups corresponding to a plurality of output data streams, wherein said plurality of output data streams respectively correspond to said plurality of initial states; and (c3) converting said current reverse decoded data groups in a forward direction to produce said current decoded data groups.

19. A Viterbi decoding method as claimed in claim 18, wherein said step (d) comprises the steps of:

(d1) determining a state of said initial portion of decoded data corresponding to said subsequent reproduced signal group; and (d2) selecting said particular current decoded data group based on said state; and (d3) concatenating said final portion of decoded data within said particular current decoded data group and said initial portion of decoded data corresponding to said subsequent reproduced signal group.

20. A Viterbi decoding method as claimed in claim 18, wherein said step (c) further comprises the step of:
- (c4) delaying said current decoded data groups until a state of said initial portion of decoded data corresponding to said subsequent reproduced signal group is determined.

21. A Viterbi decoding circuit for demodulating a reproduced signal in a magnetic recording/reproducing apparatus comprising:
- peak detecting means for interlocking a positive peak detecting threshold and a negative peak detecting threshold in order to maintain a difference between said positive and negative peak detecting thresholds at a predetermined offset value, for detecting positive peak values and negative peak values of a current reproduced signal group, and for generating positive peak data values and negative peak data values corresponding to said current reproduced signal group, wherein said positive peak data values and said negative peak data values are instantaneous values and wherein said reproduced signal is grouped into at least said current reproduced signal group and a subsequent reproduced signal group;
- first reverse converting means for converting said positive peak data in a reverse direction to produce reverse positive peak data;
- second reverse converting means for converting said negative peak data in a reverse direction to produce reverse negative peak data;
- Viterbi-decoding means for Viterbi-decoding said reverse positive peak data and said reverse negative peak data with respect to both a first initial state and a second initial state to generate a first current reverse decoded data group which corresponds to a first output data stream and a second current reverse decoded data group which corresponds to a second output data stream, wherein said first and second current reverse decoded data groups respectively correspond to said first and second initial states and wherein said Viterbi decoding means generates a selection control signal based on a state of initial decoded data of said subsequent reproduced signal group;
- first forward converting means for converting said first current reverse decoded data group in a forward direction to produce a first current forward decoded data group for said first output data stream;
- second forward converting means for converting said second current reverse decoded data group in said forward direction to produce a second current forward decoded data group for said second output data stream; and
- selecting means for selecting one of said first current forward decoded data group and said second current forward decoded data group as a selected current forward decoded data group, wherein said one of said first current forward decoded data group and said second current forward decoded data group is selected based on said selection control signal.

22. A Viterbi decoding circuit as claimed in claim 21, further comprising an amplifier which amplifies said current reproduced signal group to produce an amplified signal and which outputs said amplified signal to said peak detecting means.

23. A Viterbi decoding circuit as claimed in claim 21, wherein said peak detecting means comprises:
- a first comparator for comparing said current reproduced signal group with said positive peak detecting threshold and outputting said positive peak data values; and
- a second comparator for comparing said current reproduced signal group with said negative peak detecting threshold and outputting said negative peak data values.

24. A Viterbi decoding circuit as claimed in claim 21, wherein said first reverse converting means comprises a first serial-input/parallel-output type shift register memory and a first parallel-input/serial-output type shift register memory and wherein said second reverse converting means comprises a second serial-input/parallel-output type shift register memory and a second parallel-input/serial-output type shift register memory.

25. A Viterbi decoding circuit as claimed in claim 21, wherein said first forward converting means comprises a first serial-input/parallel-output type shift register memory and a first parallel-input/serial-output type shift register memory and wherein said second forward converting means comprises a second serial-input/parallel-output type shift register memory and a second parallel-input/serial-output type shift register memory.

26. A Viterbi decoding circuit as claimed in claim 21, wherein said Viterbi decoding means comprises:
- an initial state setting circuit for setting said first initial state corresponding to said first current reverse decoded data group and for setting said second initial state corresponding to said second current reverse decoded data group;
- a first decoding logic circuit for performing a logic operation with respect to said first initial state, said reverse positive peak data, and said reverse negative peak data and for outputting said first current reverse decoded data group;
- a second decoding logic circuit for performing a logic operation with respect to said second initial state, said reverse positive peak data, and said reverse negative peak data and for outputting said second current reverse decoded data group; and
- a selection control signal generating circuit for generating said selection control signal based on said state of said initial decoded data of said subsequent reproduced signal group.

27. A Viterbi decoding circuit as claimed in claim 21, wherein said selecting means comprises:
- a first shift register for delaying said first current forward decoded data group until said selection control signal is generated;
- a second shift register for delaying said second current forward decoded data group until said selection control signal is generated; and
- a switching device for selecting an output of said first and second shift registers in response to said selection control signal.

* * * * *